(12) United States Patent
Do et al.

(10) Patent No.: US 6,805,976 B2
(45) Date of Patent: Oct. 19, 2004

(54) ORGANIC ELECTROLUMINESCENT DEVICE AND PREPARATION THEREOF

(75) Inventors: Lee-Mi Do, Taejon (KR); Jeong Ik Lee, Gyeonggi-do (KR); Hye Yong Chu, Taejon (KR); Seong Hyun Kim, Taejon (KR); Tae Hyoung Zyung, Taejon (KR); Hyo Young Lee, Taejon (KR); Hong-Ku Shim, Taejon (KR); Byung-Jun Jung, Busan (KR); Chong-Bok Yoon, Seoul (KR)

(73) Assignees: Electronics and Telecommunications Research Institute, Taejon (KR); Korea Advanced Institute of Science and Technology, Taejon (KR)

( * ) Notice: Subject to any disclaimer, the term of this patent is extended or adjusted under 35 U.S.C. 154(b) by 20 days.

(21) Appl. No.: 10/033,445

(22) Filed: Dec. 28, 2001

(65) Prior Publication Data

US 2002/0086181 A1 Jul. 4, 2002

(30) Foreign Application Priority Data

Dec. 30, 2000 (KR) ........................................ 2000-87121

(51) Int. Cl.$^7$ .............................................. H05B 33/14
(52) U.S. Cl. ........................ 428/690; 428/917; 313/504
(58) Field of Search ................................. 428/690, 917; 313/504, 506, 509; 257/102, 103; 252/301.16

(56) References Cited

U.S. PATENT DOCUMENTS

| 4,145,215 A | * | 3/1979 | Van Allan et al. |
| 4,769,292 A | * | 9/1988 | Tang et al. .................. 428/690 |
| 5,561,733 A | * | 10/1996 | Ermer et al. ................. 385/143 |

FOREIGN PATENT DOCUMENTS

| JP | 2001-19946 A | * | 1/2000 |
| KR | 10-025976 B1 | | 1/2000 |

OTHER PUBLICATIONS

Notice of Preliminary Rejection dated Dec. 16, 2002 and English translation of Notice of Preliminary Rejection for foreign Patent Document 1019980015694 (KR 10–025976 B1).

* cited by examiner

*Primary Examiner*—Marie Yamnitzky
(74) *Attorney, Agent, or Firm*—Blakely Sokoloff Taylor & Zafman

(57) ABSTRACT

In the organic electroluminescence (EL) device containing a bis-condensed derivative of 4-(dicyanomethylene)-2-methyl-6-(para-(dimethylaminostyryl)-4H-pyran, and the preparation thereof, the inventive organic electroluminescence device has a high luminescent efficiency and color coordinates based on a high purity, and is further simple in a synthesis and is prominent in a thermal stability, thereby providing great merits to a mass production of the organic electroluminescence device.

2 Claims, 5 Drawing Sheets

ORGANIC ELECTROLUMINESCENT DEVICE AND PREPARATION THEREOF

FIELD OF THE INVENTION

The present invention relates to an organic electroluminescent (EL) device and a preparation thereof; and, more particularly, to an organic EL device and a preparation thereof, in which a new bis-condensed DCM (4-(dicyanomethylene)-2-methyl-6-(para-(dimethylaminostyryl)-4H-pyran) derivative is used as an electroluminescence material.

PRIOR ART OF THE INVENTION

An organic emitting layer is gained by recombining electron and hole, and contains an emitting material representing electroluminescence, as a most simple structure, and also this emitting layer (EML) is provided as a single layer representing a high fluorescent quantum yield such as tris-(8-hydroxyquinoline) aluminum (hereinafter, referred to as $Alq_3$).

Organic EL devices (OELDS) have been much researched for an application to a flat plate display which has a high efficiency, full color and a low voltage driving, since Tang's publication (Appl. Phys. Lett. 51, 913 (1987)). However, a red (R), green (G) or blue (B) EML, which has a high luminescent efficiency and color coordinates based on a high purity and is stable in heat, is required to get full color EL display.

In a red emitting layer of a conventional technique to obtain red color, there is a method of doping, by a number of wt% and below, derivative of DCM represented in the following chemical formula 1 as a guest, or a fluorescent material of red color such as porphyrin, on a host such as a Alq3, or of using metal complex for EML (Appl. Phys. Lett. 69, 2959 (1996), ibid, 65, 2124 (1994)).

[Chemical Formula 1]

![DCM structure]

Y. Hamada et al. attempted to obtain pure red having a narrow width of spectrum by using Rubrene with emitting assist dopant (EA) which serves as an energy transfer role from the host to the dopant though itself does not emit light, in order to complement the shortcoming mentioned above in the device using a DCJ represented in the following chemical formula 2, but did not yet obtain high purity red color (red color coordinates on NTSC: 0.67, 0.33).

[Chemical Formula 2]

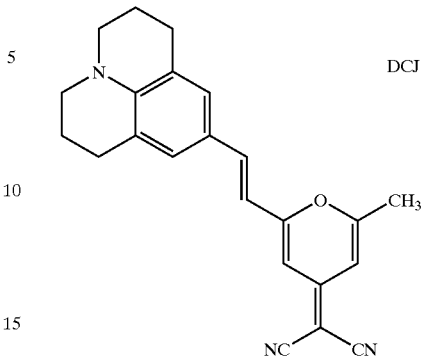

Among methods to gain red OELDs, in a general phenomenon occurring when a red emitting material such as DCM is doped as a guest on a host such as $Alq_3$, there are shortcomings that emission spectrum is shifted to long wavelength in a range of 590 nm–650 nm according to a concentration increase of dopant, and that a luminous efficiency becomes lower.

V. Bulovic et al. had reported that a shift phenomenon of an emission wavelength is caused by polarization effects of a red fluorescent material such as DCJ (Chem. Phys. Lett., 287(1998)455), and that the emission wavelength becomes a red shift according that the polarization phenomenon is getting increased, namely, a dipole moment value is getting large.

The red shift of the spectrum based on a concentration change of the DCM dopant and a reduction of the luminous efficiency are caused by an interaction between the dopant in a high concentration thereof, which is well-known as a concentration quenching. Therefore, in order to reduce such concentration quenching, a methyl group is induced into a julolidin ring, to then compose DCJT represented in the following chemical formula 3 (Proc. $2^{nd}$ Internat. Sym. Chem. Functional Dyes, 1992, 536).

[Chemical Formula 3]

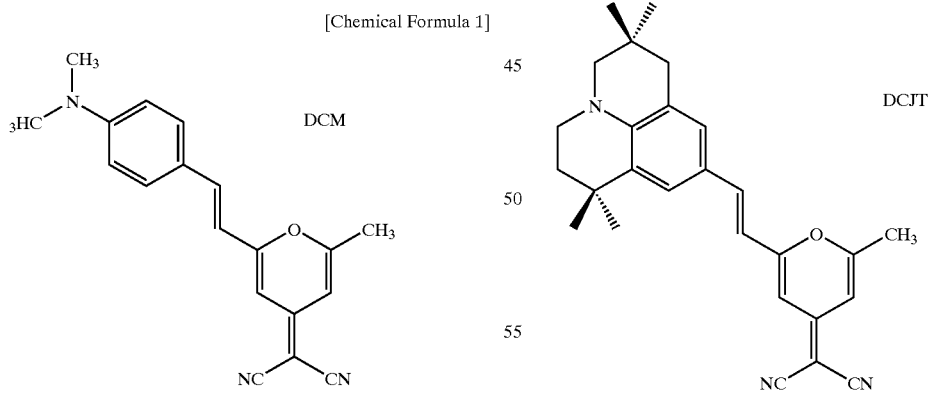

C. H. Chen et al. introduced substituents such as phenyl (DCJP), ethyl (DCJTE), t-butyl (DCJPB), and mesityl (DCJTM) groups as shown in the following chemical formula 4, instead of a methyl group of an activated pyran ring. Among them, the DCJTB most prominent in an aspect of luminescent efficiency reduced the phenomenon of the concentration quenching, but the emission spectrum gained 615 nm (Macromol. Symp. 125, 49(1997), U.S. Pat. No. 5,908, 581).

[Chemical Formula 4]

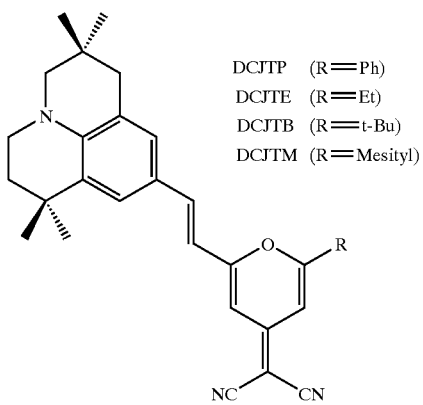

DCJTP (R=Ph)
DCJTE (R=Et)
DCJTB (R=t-Bu)
DCJTM (R=Mesityl)

Further, C. H. Chen et al. introduced an isopropyl group instead of the t-butyl group, to compose DCJTI represented in the following chemical formula 5 through a simple synthesis process than DCTJB so as to obtain a red electroluminescence material at a lower price. The DCJTI obtained the emission spectrum of 615 nm such as DCJTB, but did not yet obtain red color based on the high purity (Reference to Thin Solid Films 363, 327(2000)).

[Chemical Formula 5]

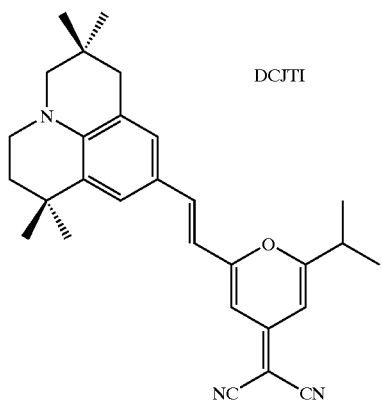

DCJTI

As above-described, in the red organic electroluminescence most well-known until now, there is the method of doping the DCM derivative on the $Alq_3$ host, but there is still a shortcoming that luminescence of $Alq_3$ itself as peak: 524 nm is reduced in the concentration increase of the dopant and luminescence of the red dopant is increased, to thus cause a shift to the long wavelength in the range of 600–650 nm.

SUMMARY OF THE INVENTION

Therefore, it is an object of the present invention to provide organic electroluminescence devices and a preparation thereof, in which bis-condensed DCM derivative based on a new concept is used as a red electroluminescent material so as to gain high purity red color (CIE: 0.67,0.33) luminescence of NTSC (National Television System Committee) with smaller concentration than red color dopant known up to now.

Another object of the present invention is to provide OELD, which is thermally stable and simple in synthesis, and represents a red color based on high purity, and a preparation thereof.

To achieve these and other advantages, and in accordance with the purpose of the present invention, it is provided OELDs composed of an organic emitting layer containing a compound which has a structure of the following chemical formula 6.

[Chemical Formula 6]

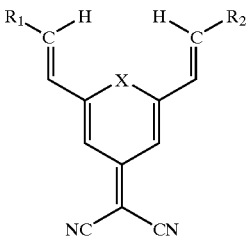

In the formula 6, X is O, S, $CH_2$ or NR, R is a lower alkyl group; and $R_1$ and $R_2$ are either fused ring structures having a ring-contained tertiary amine or 2-(dialkylamino) thienyl rings.

The compound having the structure of the chemical formula 6 contains compound represented in the following chemical formulas 7 through 10.

[Chemical Formula 7]

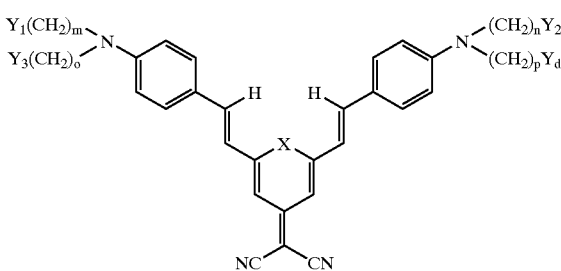

[Chemical Formula 8]

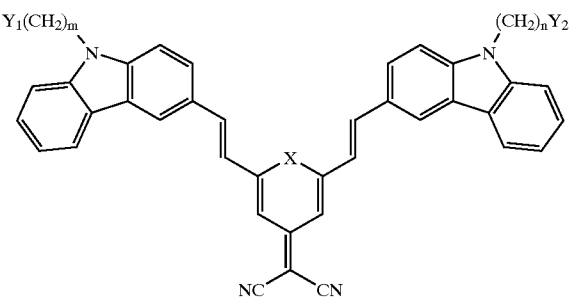

[Chemical Formula 9]

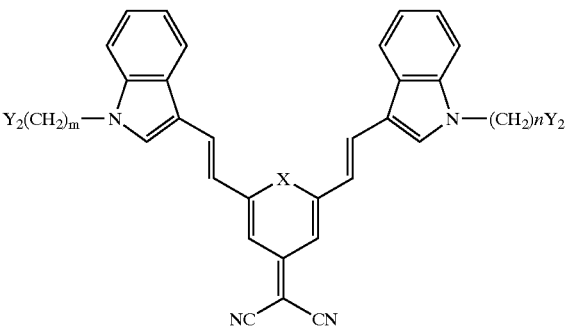

[Chemical Formula 10]

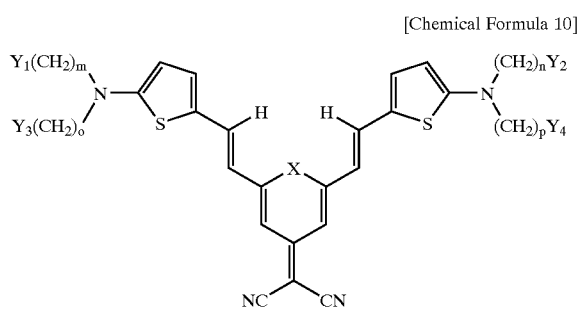

In the above chemical formulas 7 through 10, it has no problem that X is O, S, $CH_2$ or NR, R being a lower alkyl group; $Y_1$, $Y_2$, $Y_3$ and $Y_4$ individually indicate H or OH; and m, n, o and p individually represent an integer between 1 and 20.

Or, in the chemical formulas 7 and 10, it has no problem that, $Y_1$ and $Y_3$ are cyclic amine types in which the sum of —$CH_2CH_2$—, m+0 is an integer from 0 to 2, and that $Y_2$ and $Y_4$ taken together are —$CH_2CH_2$—, forming a cyclic amine wherein in sum of n+p is an integer from 0 to 2.

The OELDs have a structure that an anode 120, an organic medium layer 150 and a cathode 190 are sequentially multilayered, and it can be also constructed by a structure that a dielectric layer 160 is formed between the anode and the cathode.

The inventive method of manufacturing the OELDs includes the steps of: forming the anode 120 on a device substrate 110; forming the organic medium layer 150 containing a compound having the structure of the chemical formula 6; and forming the cathode on top of the organic medium layer 150. Herewith, it is desirable that the compound of the chemical formula 6 is contained by a concentration of 20 weight % and below based on the host organic emitting layer. It is also desirable that the compound of the chemical formula 6 is uniformly mixed and doped in polymers matrix in the forming step of the organic medium layer.

In the invention, further, a self-emitting display containing the inventive OELDs is provided.

Doping one or two or more dopants on the host material provides the afore-described red emitting material, and the EL device based on a high efficiency is constructed by using such method. Color of the EL device can be also obtained by using fluorescent materials having mutually different luminescent wavelength with a general host material. The structure of the dopant in which the $Alq_3$ is provided as the host, in the EL device, was described in detail by Tang (J. Appl. Phys., 75, 3610(1989); U.S. Pat. No. 4,769,292).

The most important relation to select the red fluorescent materials as the dopant is to energy transfer of a host corresponding to a band gap as an energy difference between highest occupied molecular orbital (HOMO) and lowest unoccupied molecular orbital (LUMO) to the dopant. That is, a requisite condition in an occurrence of an efficient energy transition from the host to the dopant is that the band gap of the dopant must be smaller than the host material. Therefore, in a characteristic of the OELD in accordance with the present invention, the larger polarization phenomenon becomes, it moves to the long wavelength and the band gap becomes small, and herewith, a phenomenon representing red fluorescence, which is referred to Chem. Phys. Lett., 287(1998)455, J. Am. Chem. Soc. 1996, 118, 12950, is used, in other words, a material for representing large dipole moments having hyper polarizabilitis is used as red luminescent materials of the high purity.

That is, the red emitting material used in the invention is provided as a symmetrical type structure of a bis-condensed Y shape based on the DCM like the structure of the chemical formula 6, and is the structure of donor(D)-acceptor(A)-donor (D) having hyper polarizability, the structure having one acceptor part of (dicyanomethylene) pyran and two donor parts containing N. In this invention, therefore, red color luminescence based on the high purity, which is red color coordinates on the NTSC, 0.67, 0.33, can be obtained by using the fluorescent materials of the bis-condensed DAD structure.

The bis-condensed DCM derivatives used in the invention perform a bis-condensation without inertness of an active methyl group, in comparing it with DCJTB or DCJTI most well-known as red dopant until now, thereby being possible to reduce a synthesis process, it is also a merit in an aspect of a mass production and low price.

The inventive OELDs include the following three constructive elements. Namely, they are first an anode 120 substrate, secondly the red organic medium layer 150 made by the red dopant material, and thirdly the cathode 190. The device may have the structure that a dielectric layer is inserted between the anode and the cathode and such dual dielectric layer prevents a flowing of charge, not only to reduce leakage current but also to increase a recombination probability of the electron and the hole, therefore, a luminescence efficiency is increased.

The inventive bis-condensed red luminescent material may provide an emitting layer through a co-evaporation together with the host material such as $Alq_3$, and may also provide a red EML by a spin-coating on a polymers host material such as PVK and then by drying a solvent to thus manufacture the red EML.

The red dopant used in the inventive embodiments is represented in following chemical formulas 11 (2,6-bis-(2-(5-(dibutylamine)phenyl)vinyl)-4H-pyran-4-ylidene) propane-dinitrile, DADB) and 12 (2,6-bis-(2-(5-(diphenylamine)phenyl)vinyl)-4H-pyran-4-ylidene) propane-dinitrile, DADP).

[Chemical Formula 11]

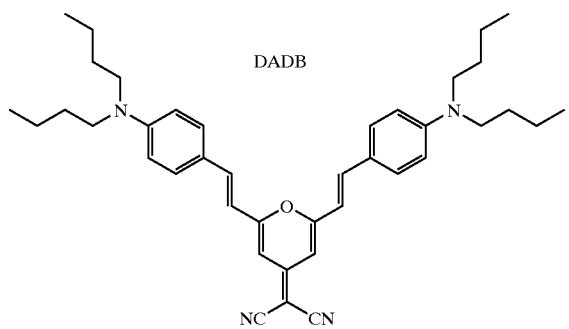

DADB

[Chemical Formula 12]

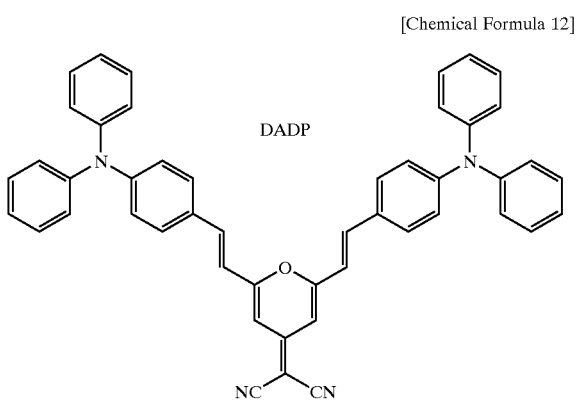

DADP

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

Hereinafter, preferred embodiments of the present invention will be described in detail with reference to the accompanying drawings.

Embodiment 1: Manufacture for red OELDS of ITO (120)/PVX-RED-PED(150)/Al(190)

Figure 1:
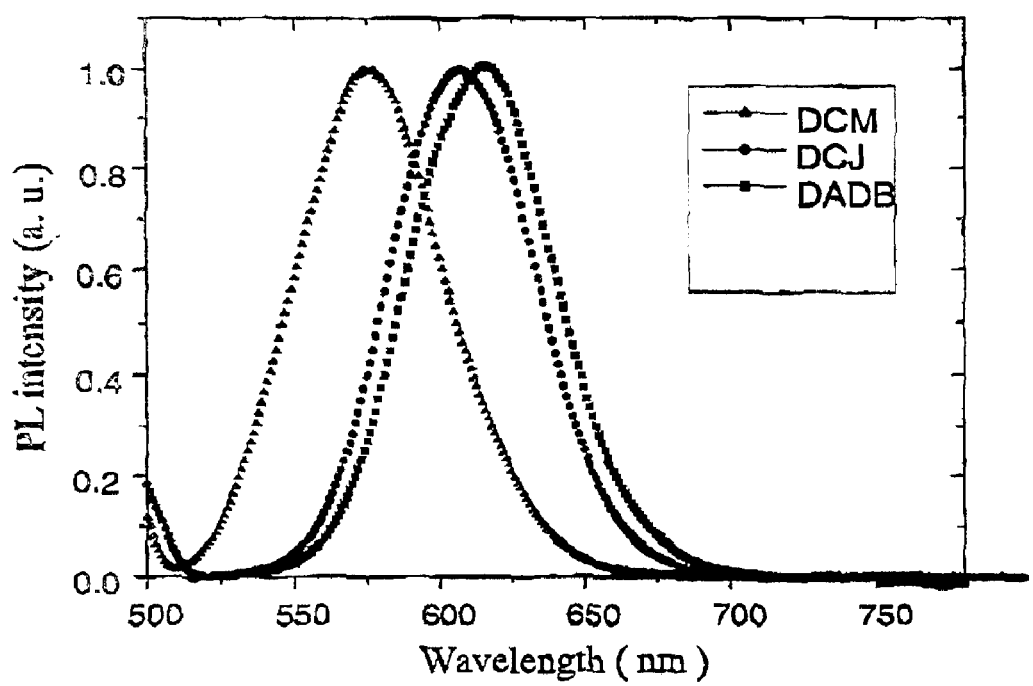
FIG. 1 represents a graph showing fluorescent spectrum of a red dopant (DCM, DCJ, and DADB) in methylenechloride solution.
Figure 2:
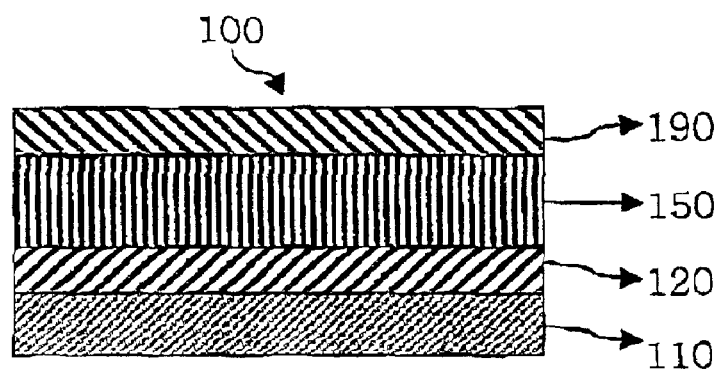
FIG. 2 presents a sectional view showing the structure of red OELDs in an inventive embodiment 1.

A manufacturing procedure of red OELDs based on this inventive embodiment will be described with reference to FIG. 2.

Poly(N-vinylcarbazole)(PVK) of 70 wt % and 2-(4-biphenylyl)-5-(4-tertiary-butylphenyl)1,3,4-oxadiazole (PBD) of 25 wt % as the polymers host material, and DADB of 5 wt % as a red dopant in chloroform solvent is manufactured by a concentration of 20 mg/ml.

After that, red EML solution is spin coated on Indium Tin Oxide (ITO) electrode 120 under 1000 rpm, 30 sec, and then the solvent is eliminated under 100 degrees temperature, to thereby form a red EML 150. Al of 100 nm or more is formed on such thin film through a thermal vacuum evaporating method or a sputtering method.

Figure 3:
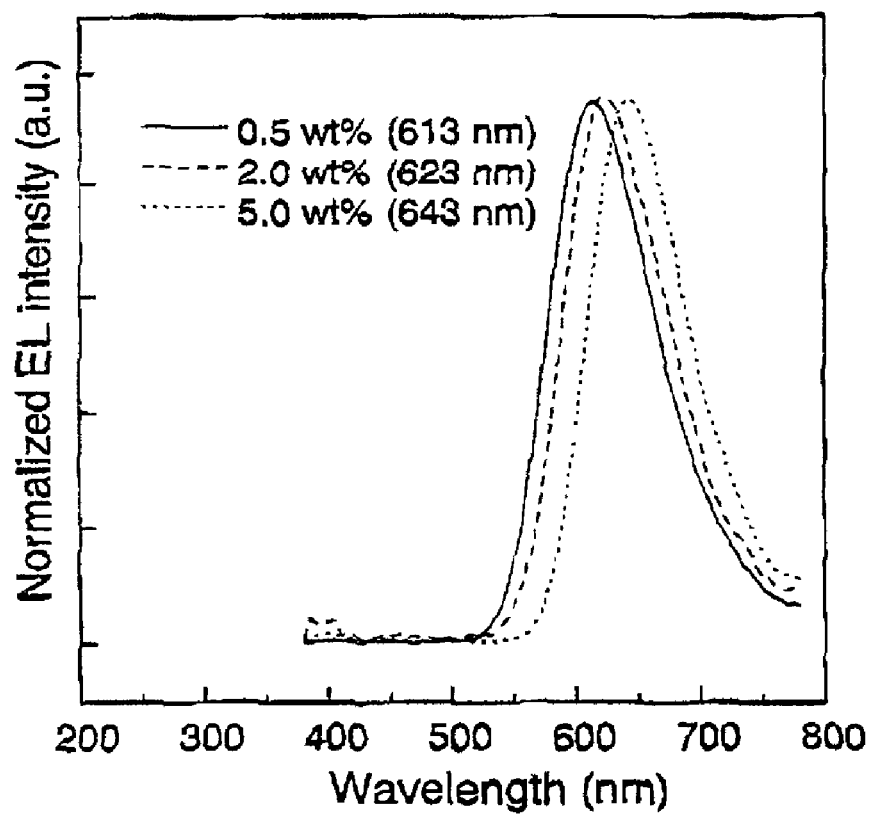
FIG. 3 is a graph showing EL spectrum of red OELDS manufactured by the inventive embodiment 1.

EL spectrum based on a concentration change of dopant (DADB) is represented in FIG. 3, in the device manufactured by the inventive embodiment 1.

Embodiment 2: Manufacture for red OELDs of ITO(120)/PEDOT(151)/PVK-RED-PBD(153))/Al(190)

Figure 4:
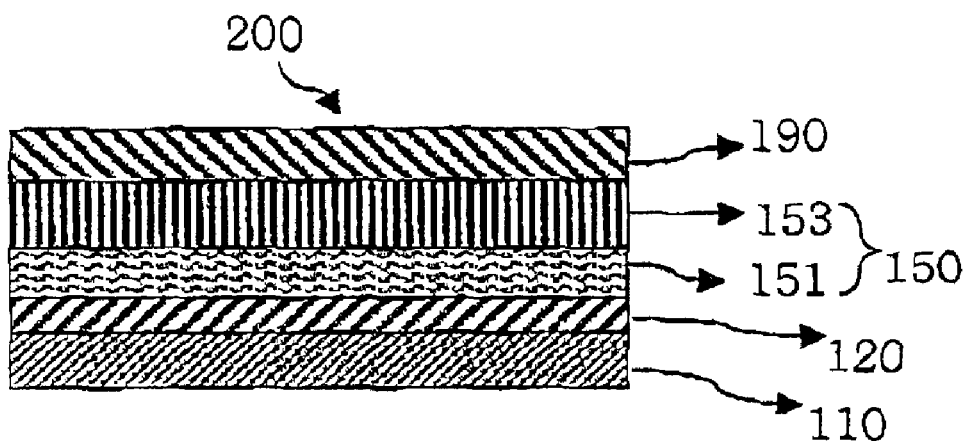
FIG. 4 illustrates a sectional view showing the structure of a red color organic EL device in an inventive embodiment 2.

A manufacturing procedure of red OELDs, in this inventive embodiment will be described with reference to FIG. 4.

Polyethylenedioxythiophene solution (hereinafter, referred to as PEDOT) is spin-coated on the cleansed ITO electrode 120 and then is thermal-processed to eliminate the solvent and to thereby form a hole injection layer (HIL) 151. In order to make a red EML, as the polymers host material, PVK of 7 wt %, PBD of 20 wt % and the DADB of 5 wt % as the red dopant are prepared by a concentration of 20 mg/ml in the chloroform solvent. The solution is spin-coated by 1000 rpm, 30 sec, and the solvent is removed in the vacuum oven. Al is evaporated through the thermal vacuum evaporating method or the sputtering method so as to form a cathode 190 and manufacture the red OELDs.

Figure 5:
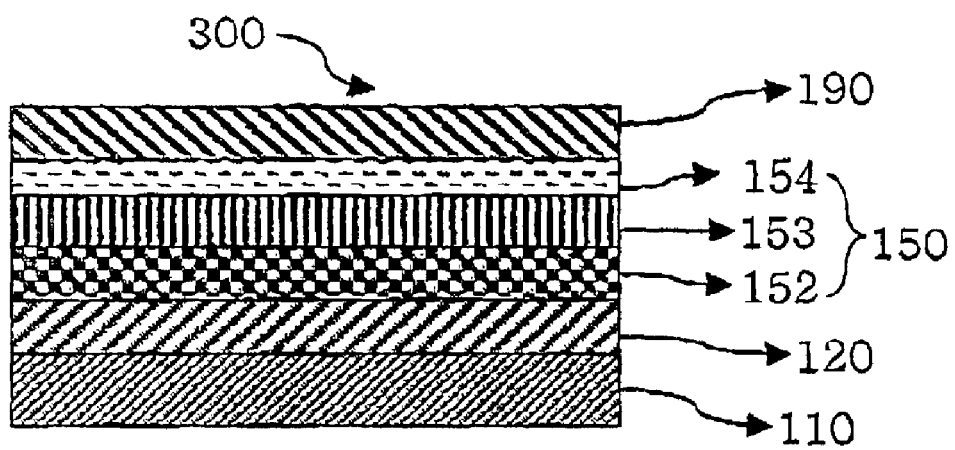
FIG. 5 depicts a sectional view for the structure of red OELDs in an inventive embodiment 3.

Embodiment 3. Manufacture for red OELDS of ITO $(120)/TPD(152)/Alq_3$-RED$(153)/Alq_3(154)/Al(190)$ The red OELD in this embodiment is provided as a structure that the anode 120, the red organic medium layer 150 and the cathode 190 are sequentially prepared like the sectional view of FIG. 5. In a characteristic of this device, the organic medium layer 150 has the structure of two layers or more, namely, the hole transporting layer (HTL) 152 and an EML 153 and the electron transporting layer (ETL) 154.

N,N-diphenyl-N, N-bis(3-methylphenyl )-1,1-biphenyl-4, 4-diamine (hereinafter, referred to as TPD) as the HTL 152 is evaporated on the ITO electrode 120. At this time, a thickness of the thin film is 50 nm and an evaporation rate is 0.1–0.4 nm/s.

After that, in order to form the red organic EMT 153 on a HTL 152, the co-evaporation is performed with $Alq_3$ of 95 wt % as the host material and the DADB based on a concentration of 5 wt % as a dopant material. Then, an $Alq_3$ thin film based on 10 nm thickness is formed as the electron transportation layer 154 on the EML 153, and after that, the Al thin film is evaporated through the thermal vacuum evaporating method or the sputtering method so as to complete the red OELDs.

Embodiment 4: Manufacture for red OELDs of ITO(120)/TPD(152)/Alq3-RED(153)/Alq3(154)/LiF(155)/Al(190)

Figure 6:
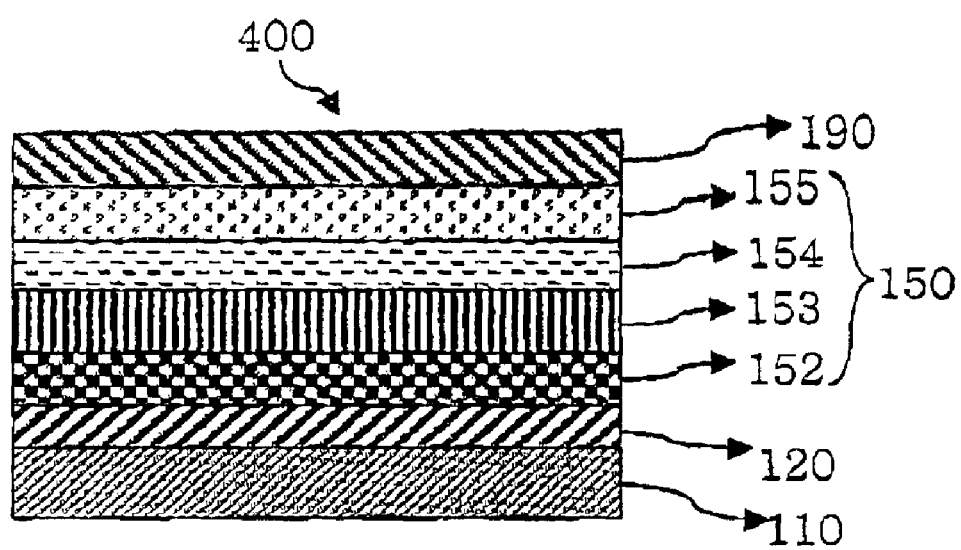
FIG. 6 is a sectional view for the structure of red OELDs in an inventive embodiment 4.

The organic EL device based on the embodiment 4 has a structure that the anode 120, the organic medium layer 150 and the cathode 190 are sequentially prepared on a substrate 110, like the sectional view of FIG. 6. In a characteristic of this device, the organic emitting layer 150 has the structure of three layers or more, namely, the HTL 152 and the EMT 153, and the electron transportation layer (ETL) 154 and the electron injection layer (EIL) 155.

In the same method as the embodiment 3, the HTL 152, the red emitting layer 153 and the ETL 154 thin films are formed on the ITO electrode 120. Then, LiF, an $Al_2O_3$, $Li_2O_3$ thin film as the EIL 155 is evaporated by about 1 nm, an evaporation rate is about 0.01 nm/sec.

Figure 7:
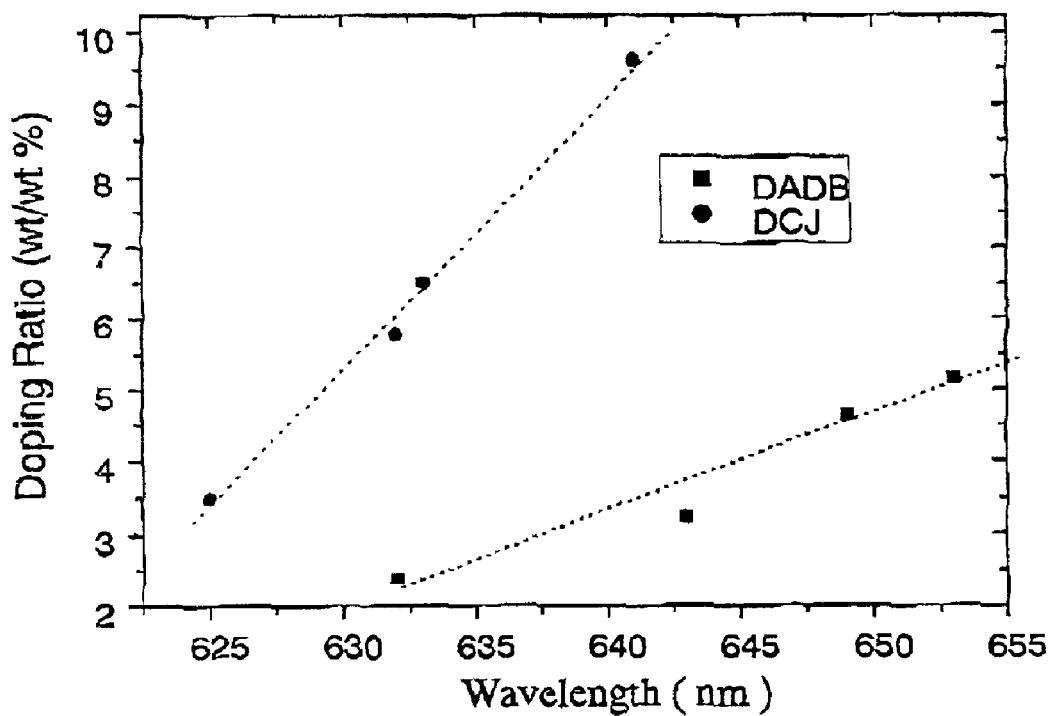
FIG. 7 is a graph showing a change of organic EL spectrum according to a concentration change of DCJ and DADB dopant in red OELDs of an inventive embodiment 4.

It is shown in FIG. 7 a change of EL wavelength based on a dopant concentration change of DCJ and DADB when the organic EL device is made by the same structure as the embodiment 4 as mentioned above.

Embodiment 5 Manufacture for red OELds of ITO(120)/ CuPc(151)/TPD(152)/Alq$_3$-RED(153)/Alq$_3$(154)/LiF(155)/ Al(190)

Figure 8:
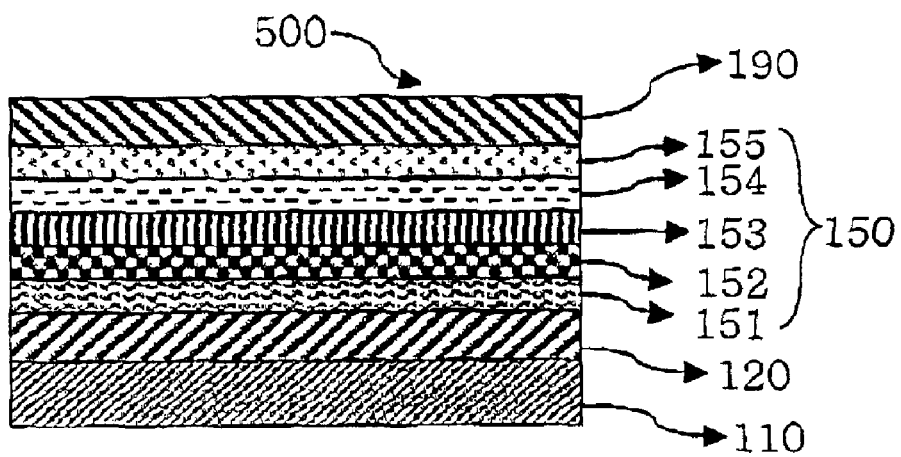
FIG. 8 shows a sectional view for the structure of red OELDs in an inventive embodiment 5.

The red OELds in this embodiment is provided as a structure that the anode 120, the organic medium layer 150 and the cathode 190 are sequentially prepared like the sectional view of FIG. 8. In a characteristic of this device, the organic medium layer 150 has the structure of four layers or more, namely, the HIL 151, the HTL 152, the emitting layer 153, the ETL 154 and the EIL 155.

A thin film based on a 15 nm thickness of phthalocyanine-copper (hereinafter, referred to as CuPc) as the HIL is firstly made on an ITO electrode 120. It can be also made by spin-coated a polymer thin film such as the PEDOT. In the same method as the embodiment 4, HTL, EML, ETL, EIL and cathode are made respectively.

Emodiment 6: Manufacture for red OELDs of ITO(120)/ LiF(130)/PEDOT(151)/TPD(152)/Alq$_3$-RED(153)/Alq$_3$ (155)/LiF(160)/Al(190)

Figure 9:
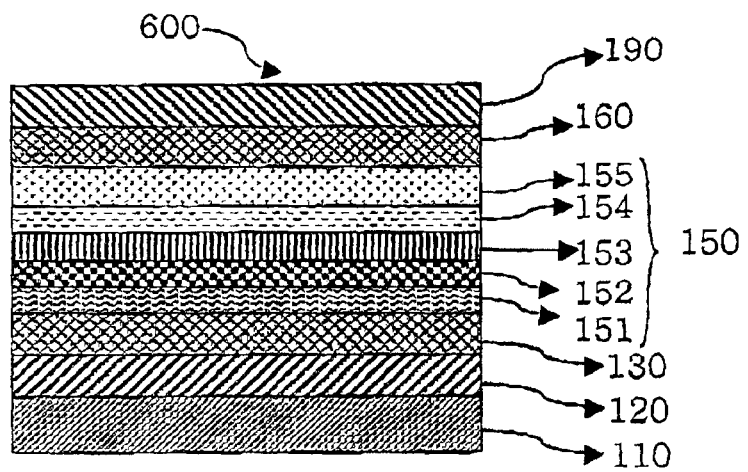
FIG. 9 is a sectional view for the structure of red OELDs in an inventive embodiment 6.

The red OELDs in this embodiment are characterized by a structure that a dual dielectric layer is formed between anode 120, and the cathode 190 like the sectional view of FIG. 9. Thus, the OELDs are provided by the structure that a first dielectric layer 130, the HIL 151, the HTL 152, the emitting layer 153, the ETL 154, the EIL 155, a second dielectric layer 160 and the cathode 190 are formed on an anode 120.

A thin film based on about 1 nm thickness of LiF as the first dielectric layer is firstly formed on the ITO electrode 120. The HIL is formed with the PEDOT through the same method as the embodiment 2. In the same method as the embodiment 4, the emitting layer 153, the ETL 154 and the EIL 155 are formed respectively. After that, the second dielectric layer is formed by the same method as the first dielectric layer, then, the cathode is formed so as to prepare the red OELDs.

The dual dielectric layer formed between the anode 120 and the cathode 190 prevent charge flowing, to thereby reduce leakage current and also increase a probability of a recombination between the electron and the hole, that is, an increase of a luminescent efficiency.

Figure 10:
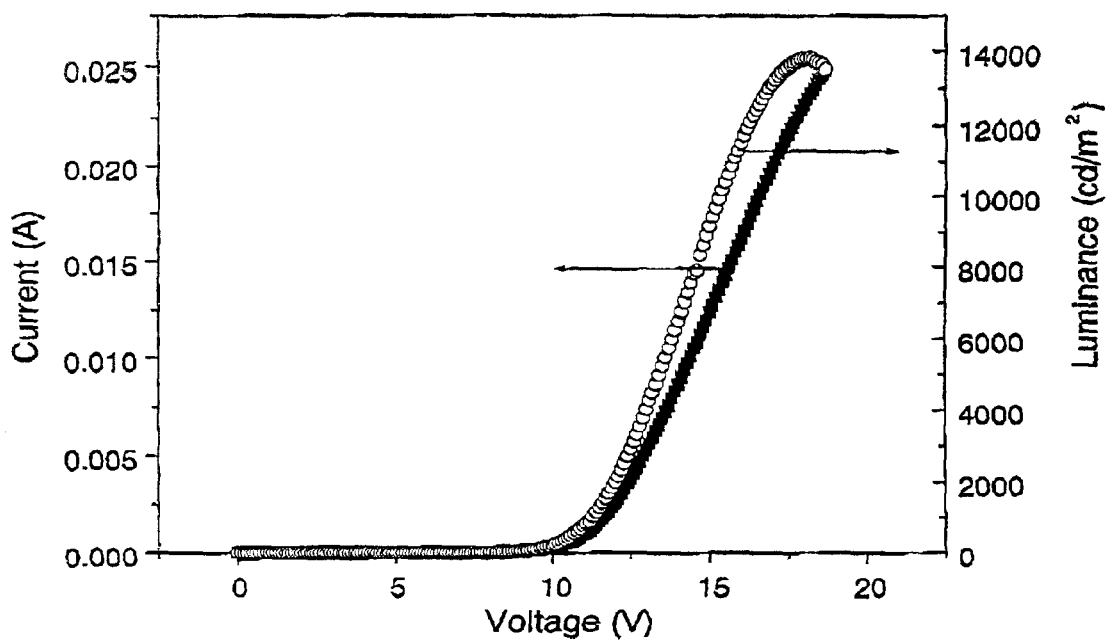
FIG. 10 is a graph showing a characteristic of current-voltage-luminescence in red OELDs of an inventive embodiment 6.

FIG. 10 is a graph showing a characteristic of current-voltage-luminescence for the red OELDs manufactured in the inventive embodiment 6.

As afore-mentioned, in accordance with the present invention, the red fluorescent materials provides hyper polarizability as the bis-condensed DAD structure, to thus enable to obtain the red color luminescence based on the higher purity moved to the long wavelength, in comparison with DCJTB or DCJTI most well-known until now. In addition, this inventive red dopant is simple in synthesis and more prominent in a thermal stability than the existing red emitting materials, therefore, the invention will have great financial effect to a mass production of the red color OELDs.

It will be apparent to those skilled in the art that various modifications and variations can be made in the present invention without deviating from the spirit or scope of the invention. Thus, it is intended that the present invention cover the modifications and variations of this invention provided they come within the scope of the appended claims and their equivalents.

What is claimed is:

1. An organic electroluminescence device, comprising an anode and a cathode, and at least one organic luminescent medium layer containing a compound of a following chemical formula 8 as:

(Chemical Formula 8)

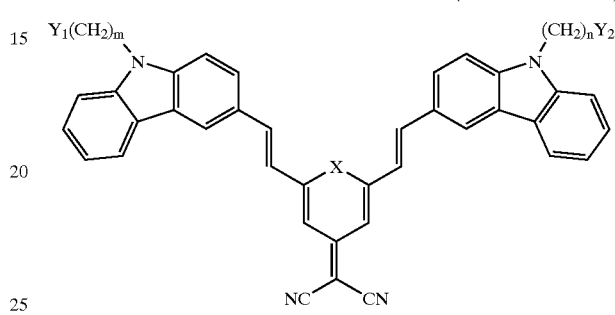

wherein X is O, S, CH$_2$ or NR, where R is a C$_1$–C$_{10}$ lower alkyl group; Y$_1$ and Y$_2$ individually indicate H or OH; and m and n individually represent an integer between 1 and 20.

2. An organic electroluminescence device, comprising an anode and a cathode, and at least one organic luminescent medium layer containing a compound of a following chemical formula 9 as:

[Chemical Formula 9]

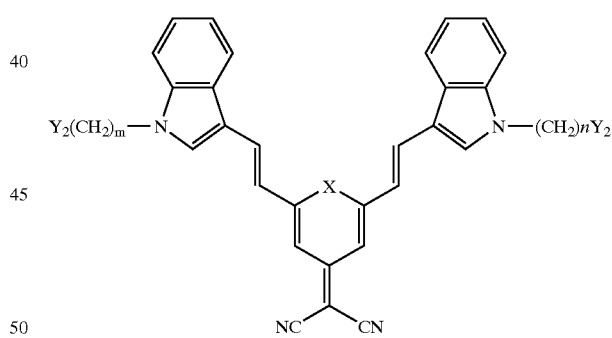

wherein X is O, S, CH$_2$ or NR, where R is a C$_1$–C$_{10}$ lower alkyl group; Y$_1$ and Y$_2$ individually indicate H or OH; and m and n individually represent an integer between 1 and 20.

* * * * *